United States Patent
McCown

(10) Patent No.: US 9,595,760 B2
(45) Date of Patent: Mar. 14, 2017

(54) ANTENNA FOCUSING RING

(71) Applicant: James Charles McCown, Erda, UT (US)

(72) Inventor: James Charles McCown, Erda, UT (US)

( * ) Notice: Subject to any disclaimer, the term of this patent is extended or adjusted under 35 U.S.C. 154(b) by 84 days.

(21) Appl. No.: 14/300,142

(22) Filed: Jun. 9, 2014

(65) Prior Publication Data

US 2015/0070244 A1    Mar. 12, 2015

Related U.S. Application Data

(60) Provisional application No. 61/832,717, filed on Jun. 7, 2013.

(51) Int. Cl.
| | |
|---|---|
| *H01Q 15/02* | (2006.01) |
| *H01Q 9/04* | (2006.01) |
| *H01Q 19/00* | (2006.01) |
| *H01Q 19/13* | (2006.01) |

(52) U.S. Cl.
CPC .......... *H01Q 9/0407* (2013.01); *H01Q 19/00* (2013.01); *H01Q 19/13* (2013.01)

(58) Field of Classification Search
CPC ........ H01Q 15/02; H01Q 19/13; H01Q 19/19; H01Q 13/02; H01Q 19/132; H01Q 1/288; H01Q 17/00
USPC .......................................... 343/909, 781 CA
See application file for complete search history.

(56) References Cited

U.S. PATENT DOCUMENTS

| | | | |
|---|---|---|---|
| 3,859,657 | A | 1/1975 | Sterner |
| 6,133,882 | A | 10/2000 | LaFleur et al. |
| 6,445,360 | B2 | 9/2002 | Al-Rawi et al. |
| 6,876,337 | B2 | 4/2005 | Larry |
| 6,891,506 | B2 | 5/2005 | Jarmuszewski et al. |
| 6,977,624 | B1 | 12/2005 | Szente et al. |
| 7,800,551 | B2 | 9/2010 | McCown |
| 2002/0097185 | A1 | 7/2002 | Hershey et al. |
| 2004/0201534 | A1 | 10/2004 | Hagiwara |
| 2005/0017906 | A1 | 1/2005 | Man et al. |
| 2013/0162492 | A1* | 6/2013 | Kishino ............... H01Q 19/134 343/781 CA |
| 2014/0292605 | A1* | 10/2014 | Roberts ................. H01Q 13/20 343/781 CA |

FOREIGN PATENT DOCUMENTS

| | | |
|---|---|---|
| EP | 1033779 A2 | 9/2000 |
| WO | WO-00/74254 A1 | 12/2000 |

\* cited by examiner

*Primary Examiner* — Dameon E Levi
*Assistant Examiner* — David Lotter
(74) *Attorney, Agent, or Firm* — Paul C. Oestreich; Eminent IP, P.C.

(57) ABSTRACT

The antenna focusing ring disclosed herein is configured for use with any given subscriber module (antenna). The antenna focusing ring may also be used to focus and concentrate the electromagnetic signal generated by the subscriber module onto a parabolic reflector antenna used in the transmission of data over wireless transmission systems. The antenna focusing ring described herein is used to increase signal gain in the wireless data transmission system by focusing and thereby correcting the poor illumination of an internal patch antenna within the given subscriber module.

18 Claims, 8 Drawing Sheets

ANTENNA FOCUSING RING

CROSS-REFERENCE TO RELATED APPLICATIONS

This nonprovisional patent application claims benefit and priority to the filing of U.S. Provisional Patent Application No. 61/832,717 filed on Jun. 7, 2013, titled "ANTENNA FOCUSING RING", the contents of which are incorporated by reference as if fully set forth herein.

BACKGROUND OF THE INVENTION

Field of the Invention

The present invention relates generally to antennas for wireless communications systems. More particularly, this invention relates to an antenna focusing ring for boosting signal strength of a subscriber module radio antenna used with a parabolic antenna system.

Description of Related Art

Conventional wireless broadband radio systems are well known for providing data and voice communications that are free from electrical connections. Popular home and office based wireless systems may be based on various wireless network communication standards. Examples of such wireless standards may include those promulgated by the Institute for Electrical and Electronics Engineers (IEEE), particularly IEEE 802.11 based standards.

More sophisticated business-based wireless communications systems suitable for building to building transmissions may operate at various frequency bands including 2.4 GHz, 900 MHz, 5.2 GHz, 5.7 GHz and 5.8 GHz with various transmission protocols. For example, the Unlicensed National Information Infrastructure radio band (UNII) is part of the radio frequency spectrum used by IEEE-802.11a wireless devices. UNII operates over various frequency ranges from about 5.2 GHz to about 5.8 GHz. Some of these more sophisticated wireless communications systems achieve greater operational distances by utilizing higher broadcasting power. However, increasing power may cause interference to other communications systems and increases cost.

One particular wireless transmission system is the Canopy® subscriber module, available from Cambium Networks, Rolling Meadows, Ill. Canopy® is a fixed wireless networking system designed for Wireless Internet Service Providers (WISPs) to provide Internet access. Canopy® products are available in point-to-point (PTP) and point-to-multipoint (PMP) configurations. However, there are other similar wireless transmission systems with antennas that operate in a similar manner, e.g., wireless transmission systems and antennas, e.g., the Access5830™ subscriber module formerly available (now a legacy product) from Trango Systems, Inc., Poway, Calif. 92064.

A typical Canopy® setup consists of a cluster of up to six co-located standard access points (APs), each with a 60 degree horizontal beam width antenna, to achieve 360 degree coverage. Commonly used APs are available in 120, 180, or 360 degree models for site-based coverage, thus decreasing the number of APs needed on a tower. Also included would be one or more backhaul modules (BMs) or otherwise out-of-band links (to carry data to/from other networks) and a Cluster Management Module (CMM) to provide power and synchronization to each Canopy® AP or Backhaul Module (BM).

Customers of the Canopy® system receive service through subscriber modules (SMs) aimed towards the AP. The SMs are typically mounted on the highest point of a building to get the best radio signal transmission. Under ideal operating conditions, the Canopy® system can communicate over distances of 3.5 miles to 15 miles depending on frequency and by using equipment with integrated antennas or externally mounted reflector antennas. For example, network operators can opt to install parabolic reflector dishes which receive the signal transmitted by a subscriber module antenna and reflect it toward an AP. Alternatively, a network operator may employ a passive parabolic antenna, such as a Stinger® passive parabolic antenna as described in U.S. Pat. No. 7,800,551 to James Charles McCown, the inventor of the present invention, and available from Wireless Beehive Manufacturing, 2000 Sunset Road, Lake Point, Utah 84074. The Stinger® passive parabolic antenna mounts onto the SM directly and amplifies the signal transmitted by a subscriber module antenna and directs it toward an AP.

However, there is always a need for new and improved systems and methods for increasing signal strength and achieving greater distances between antennas. Accordingly, there exists a need in the art for an antenna focusing ring for boosting signal strength of any suitable subscriber module radio antenna, particularly those used with a parabolic reflector antenna system.

BRIEF SUMMARY OF THE INVENTION

An antenna focusing ring is disclosed. The antenna focusing ring may include a metallic annular ring configured to surround an electromagnetic signal emitted by a subscriber module. The antenna focusing ring may further include a subscriber module hanger attached to the ring, the hanger configured to encircle the subscriber module and position the ring around the emitted signal.

Another embodiment of an antenna focusing ring is disclosed. The embodiment of an antenna focusing ring may include a metallic annular ring having a front rim and a rear rim. The embodiment of an antenna focusing ring may further include two opposed arms extending from opposite sides of the front rim. Each of the two opposed arms may end with a tang, according to this embodiment. The tangs may be opposed and parallel to each other and configured to be selectively affixed together. The two opposed arms may enclose an area when viewed from below that is essentially identical to a cross-section of a subscriber module. The embodiment of an antenna focusing ring may further include the annular ring being configured to envelop and focus an electromagnetic signal transmitted from an internal patch antenna within the subscriber module.

Yet another embodiment of an antenna focusing ring is disclosed. This embodiment of an antenna focusing ring may include a metallic annular ring having a front rim and a rear rim. This embodiment of an antenna focusing ring may further include two opposed arms extending from opposite sides of the front rim. Each of the two opposed arms may end with a tang, according to this embodiment. The tangs may be opposed and parallel to each other, according to this embodiment. The opposed tangs may be selectively affixed together. The two opposed arms may enclose a cross-sectional area identical to a cross-section of a subscriber module, according to this embodiment. The arms are configured to slide over the top of a subscriber module for a friction fit with the rear rim of the annular ring adjacent to a transmitting surface of the subscriber module. This embodiment of an antenna focusing ring may further include the annular ring being configured to envelop and focus an electromagnetic signal transmitted from an internal patch antenna within the subscriber module.

Additional features and advantages of the invention will be apparent from the detailed description which follows, taken in conjunction with the accompanying drawings, which together illustrate, by way of example, features of embodiments of the present invention.

BRIEF DESCRIPTION OF THE SEVERAL VIEWS OF THE DRAWINGS

The following drawings illustrate exemplary embodiments for carrying out the invention. Like reference numerals refer to like parts in different views or embodiments of the present invention in the drawings.

DETAILED DESCRIPTION OF THE INVENTION

Figure 1A:
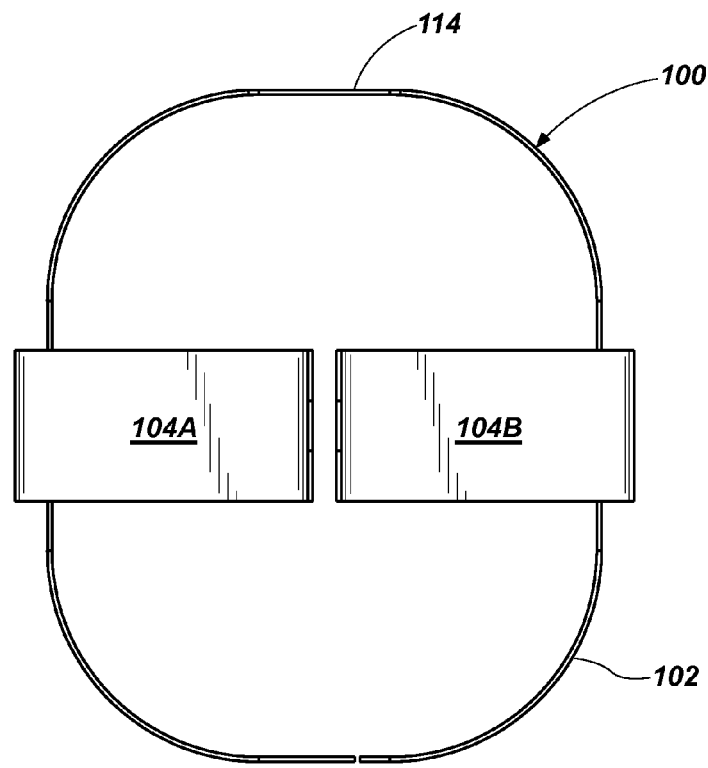
FIGS. 1A-1D are rear, right side, rear perspective and top views of an embodiment of an antenna focusing ring according to the present invention.
Figure 1B:
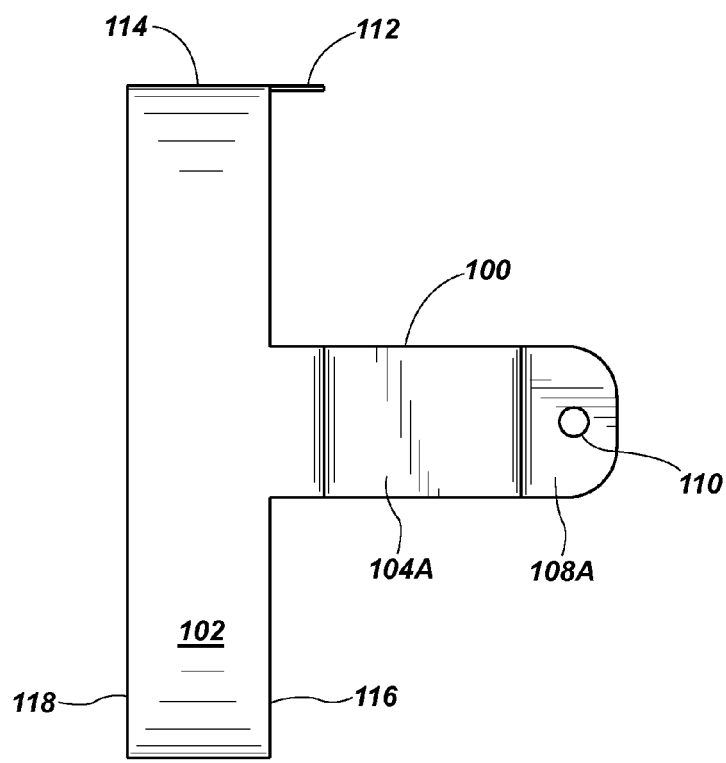
Figure 1C:
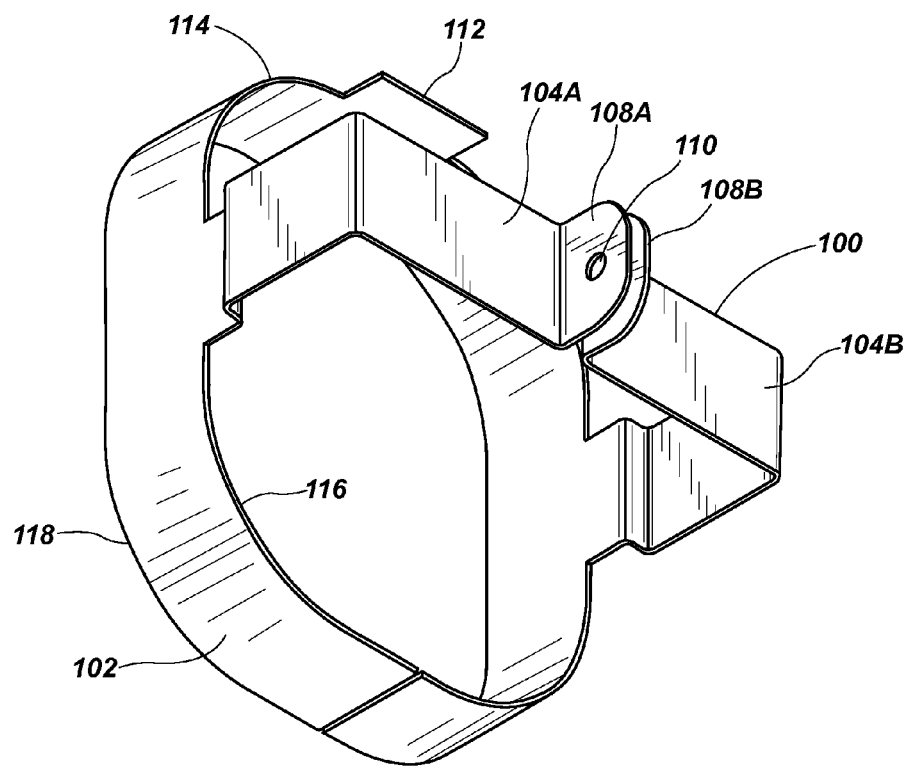
Figure 1D:
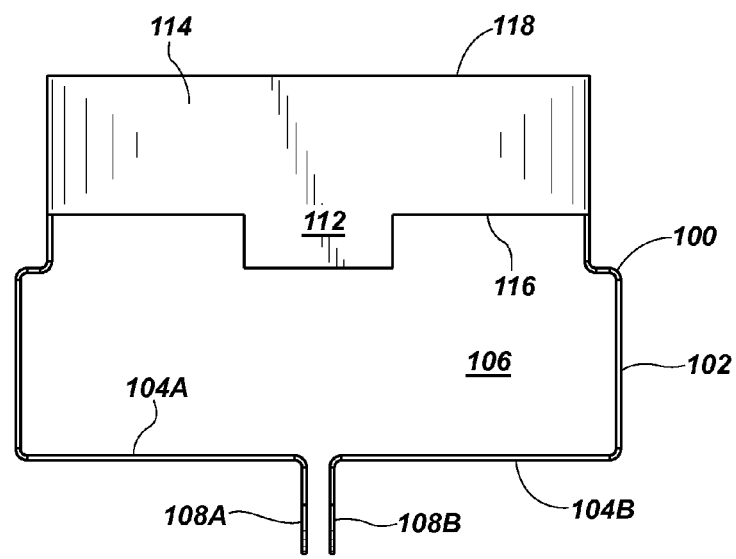

Embodiments of the antenna focusing ring described herein correct the poor illumination of the internal patch antenna located within an external subscriber module, which may or may not be wirelessly coupled to a parabolic reflector antenna.

Embodiments of the antenna focusing ring operate as a pseudo one ring scalar feed horn that focuses and improves the signal emanating from the internal patch antenna by focusing the emanated signal. That focused signal may then be concentrated onto the center of the parabolic reflector antenna or directly toward the target antenna depending on the particular system configuration. The operation of multiple ring scalar feed horns is well-known to those of ordinary skill in the art and will not be further elaborated herein. However, the application of a pseudo one ring scalar feed horn has never been attempted or suggested for such a unique and nonobvious application such as described herein.

Embodiments of the present invention include an antenna focusing ring for use with subscriber modules (antennas), e.g., Canopy® subscriber modules from Cambium Networks, Rolling Meadows, Ill., or Access5830™ subscriber modules, a legacy product of Trango Systems, Inc., Poway, Calif. The embodiments of the antenna focusing rings disclosed herein may also be used with Cambium or Trango subscriber modules paired with parabolic reflector antennas used in the transmission of data over wireless transmission systems. The antenna focusing ring described herein is used to increase signal gain in a wireless data transmission system.

FIGS. 1A-1D are rear, right side, rear perspective and top views of an embodiment of an antenna focusing ring 100 according to the present invention. The ring includes an annular ring 102 with two arms 104A and 104B that wrap around a generally rectangular space 106 (FIG. 1D) and meet with opposing tangs 108A and 108B each having a hole 110 for receiving a bolt (not shown) secured by a nut (not shown) or other suitable fastener. The rectangular space 106 may be equivalent to the cross-section of a given subscriber module antenna. Antenna focusing ring 100 may also include a stop tang 112 extending from the top 114 of annular ring 102. The stop tang 112 when resting on the top of the subscriber module 200 automatically registers the annular ring 102 with the transmitting surface of the subscriber module 200, more particularly centering the transmission path of an internal patch antenna (not shown, but see 720 in FIGS. 7A and 7B) along the axis of the annular ring 102.

The signal gain achieved by using the antenna focusing ring 100 depends on the size of the parabolic reflector antenna used and the transmission frequency used in the operation of the wireless transmission system in which the ring 100 is used. Typical gain increase is approximately 2 dB using an antenna focusing ring 100 operating at 5.8 GHz.

The antenna focusing ring 100 is intended, and configured for, outdoor use. Embodiments of the antenna focusing ring 100 may be formed of any suitable metal material, for example and not by way of limitation, aluminum, steel or stainless steel. Particular embodiments may be formed of sheet metal that has been pressed, bent or otherwise formed using methods known to those of skill in the art of metal work.

The embodiments of antenna focusing rings described herein are generally used outdoors. Accordingly, they should be treated to withstand corrosion from weather and ambient oxidation. For embodiments of antenna focusing rings comprising aluminum, a suitable surface treatment to protect from corrosion is preferred. According to one embodiment, the surface of an aluminum antenna focusing ring may be anodized to increase corrosion resistance. When exposed to air at room temperature, or any other gas containing oxygen, pure aluminum self-passivies by forming a surface layer of amorphous aluminum oxide. This natural oxide layer may range from about 2 nm to about 3 nm thick and provides effective protection against corrosion. More commonly used aluminum alloys typically form a thicker natural oxide layer, ranging from about 5 nm to about 15 nm thick, but tend to be more susceptible to corrosion. Accordingly, aluminum alloy components are preferably anodized to greatly increase the thickness of this aluminum oxide layer for improved corrosion resistance. The processes for aluminum anodization are well known to those of skill in the art of metal surface treatments, and thus, will not be further elaborated herein.

According to alternative embodiments of antenna focusing rings formed of aluminum or aluminum alloy, the surface may be treated with conversion coating, for example chromate conversion coating which will passivate the surface and provide corrosion resistance. Chromate conversion coatings on an aluminum substrate may be referred to by the following terms: chemical film and the brand names Iridite® available from MacDermid, Inc., Waterbury, Conn., and Alodine® available from Henkel AG & Co., Dusseldorf, Germany. The processes for conversion coating of aluminum substrates and particularly sheet metal are again well known to those of skill in the art of metal surface treatments, and thus, will not be further elaborated herein.

For embodiments of antenna focusing rings comprising steel, a galvanized surface treatment that may be painted, powder coated or otherwise treated to minimize corrosion is preferred. Embodiments of an antenna focusing ring formed of stainless steel may be used with or without coatings as the stainless steel is sufficiently corrosion resistant by itself.

Figure 2:
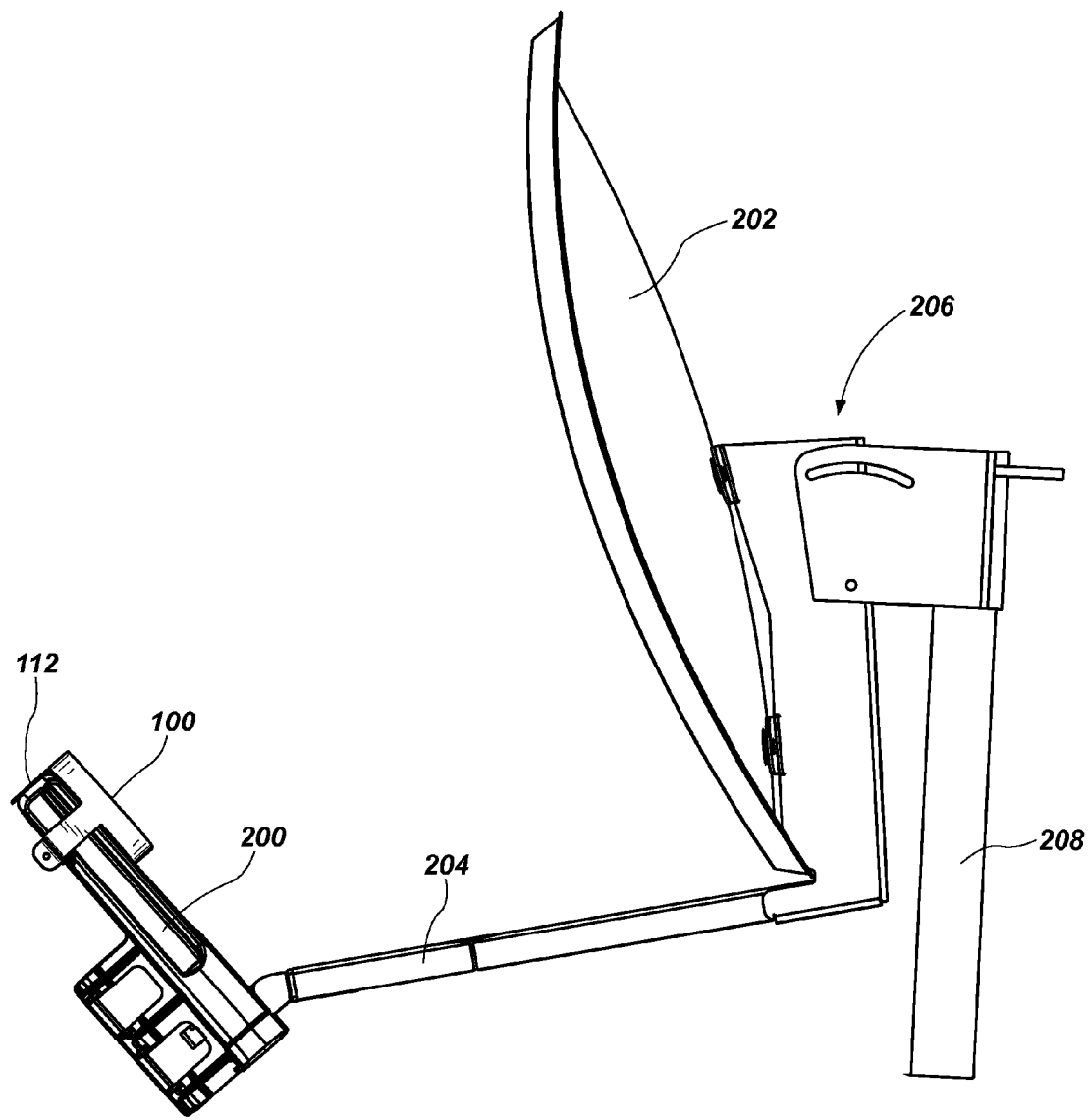
FIG. 2 is left side view of an antenna focusing ring mounted to a typical subscriber module used with a parabolic reflector antenna, according to the present invention.

FIG. 2 is left side view of an antenna focusing ring 100 mounted to a typical subscriber module 200 used with a parabolic reflector antenna 202, according to the present invention. The subscriber module 200 may be mounted on a boom 204 attached to support structure 206 that holds the parabolic reflector antenna 202. The support structure 206 may in turn be mounted to a pole 208 or other structure on a building (not shown) or mast (not shown). Note that extended portion 112 of the antenna focusing ring 100 is used to automatically index the center of the annular ring 102 around the beam emitted by the internal patch antenna (not shown) of the subscriber module 200.

Figure 3:
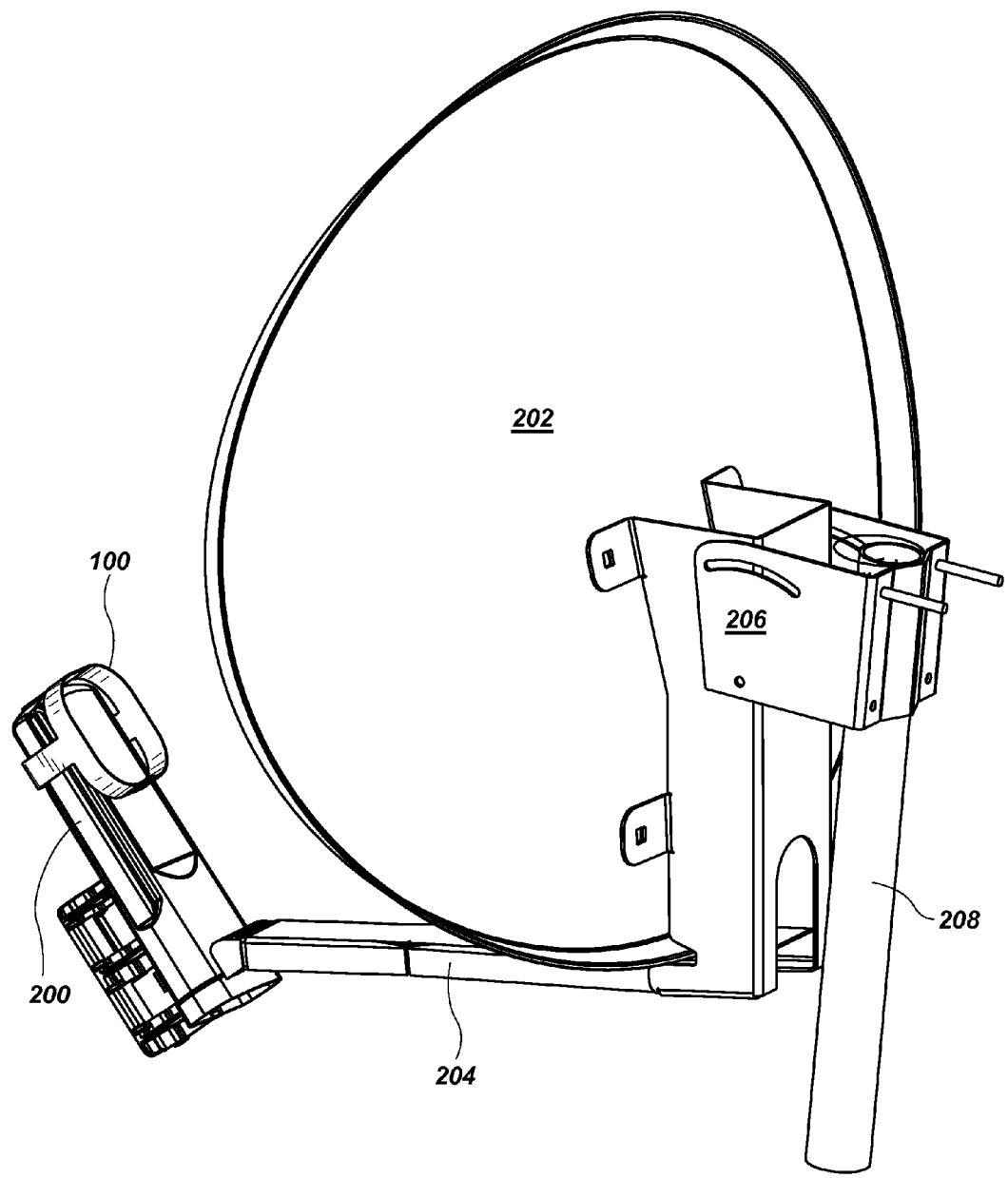
FIG. 3 is left perspective view of the antenna focusing ring mounted to a typical subscriber module used with a parabolic reflector antenna shown in FIG. 2.

FIG. 3 is left perspective view of the antenna focusing ring 100 mounted to a typical subscriber module 200 used with a parabolic reflector antenna 202 shown in FIG. 2. FIG. 3 illustrates a perspective view of the pole 208 and support structure 206 used to support a parabolic reflector antenna 202.

Figure 4:
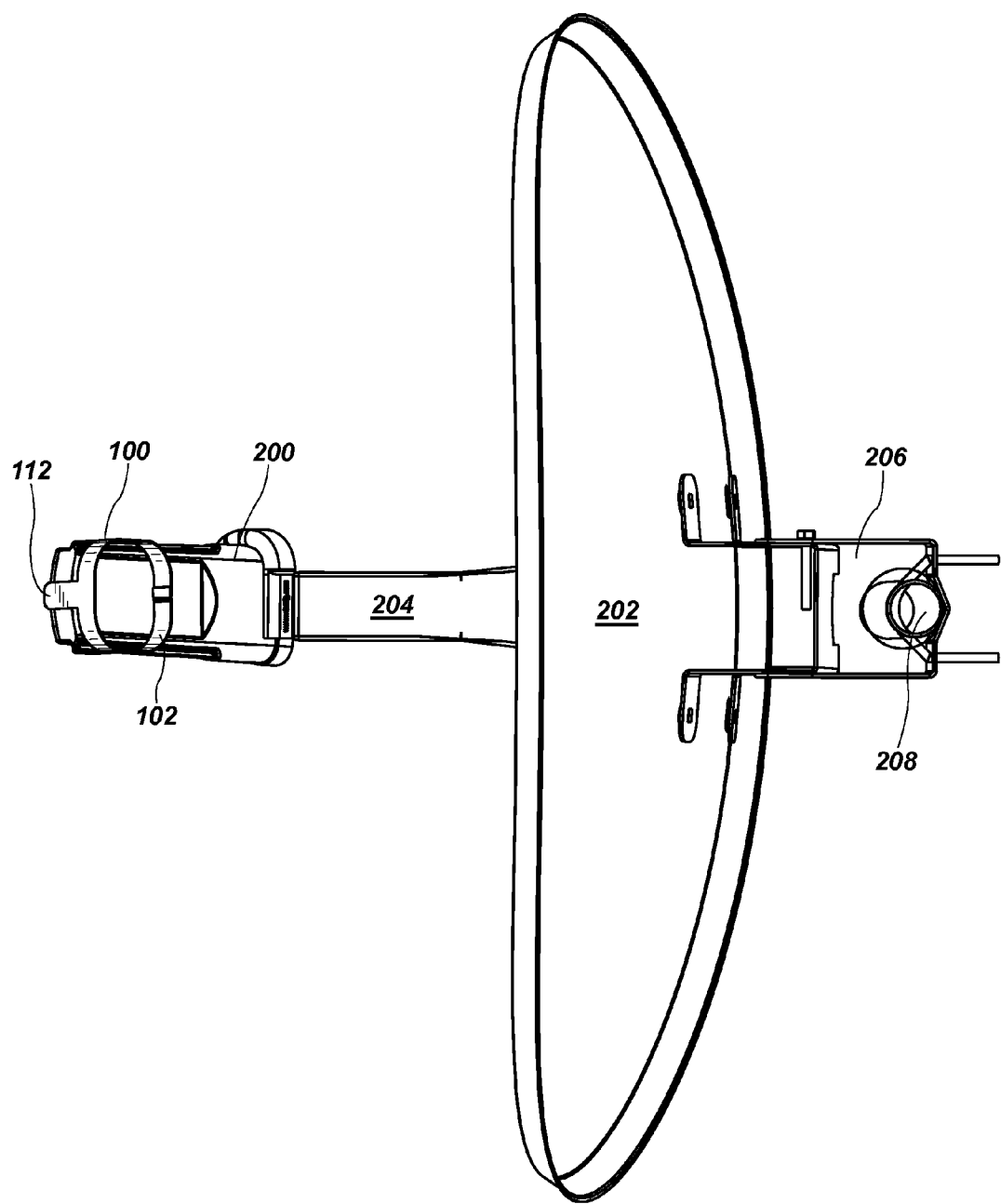
FIG. 4 is top view of the antenna focusing ring mounted to a typical subscriber module used with a parabolic reflector antenna as shown in FIGS. 2-3.

FIG. 4 is top view of the antenna focusing ring 100 mounted to a typical subscriber module 200 used with a parabolic reflector antenna 202 shown in FIGS. 2-3. FIG. 4 also illustrates the stop tang 112 resting on the top of the subscriber module 200. This configuration automatically registers the annular ring 102 with the signal transmitted from the subscriber module 200.

Figure 5:
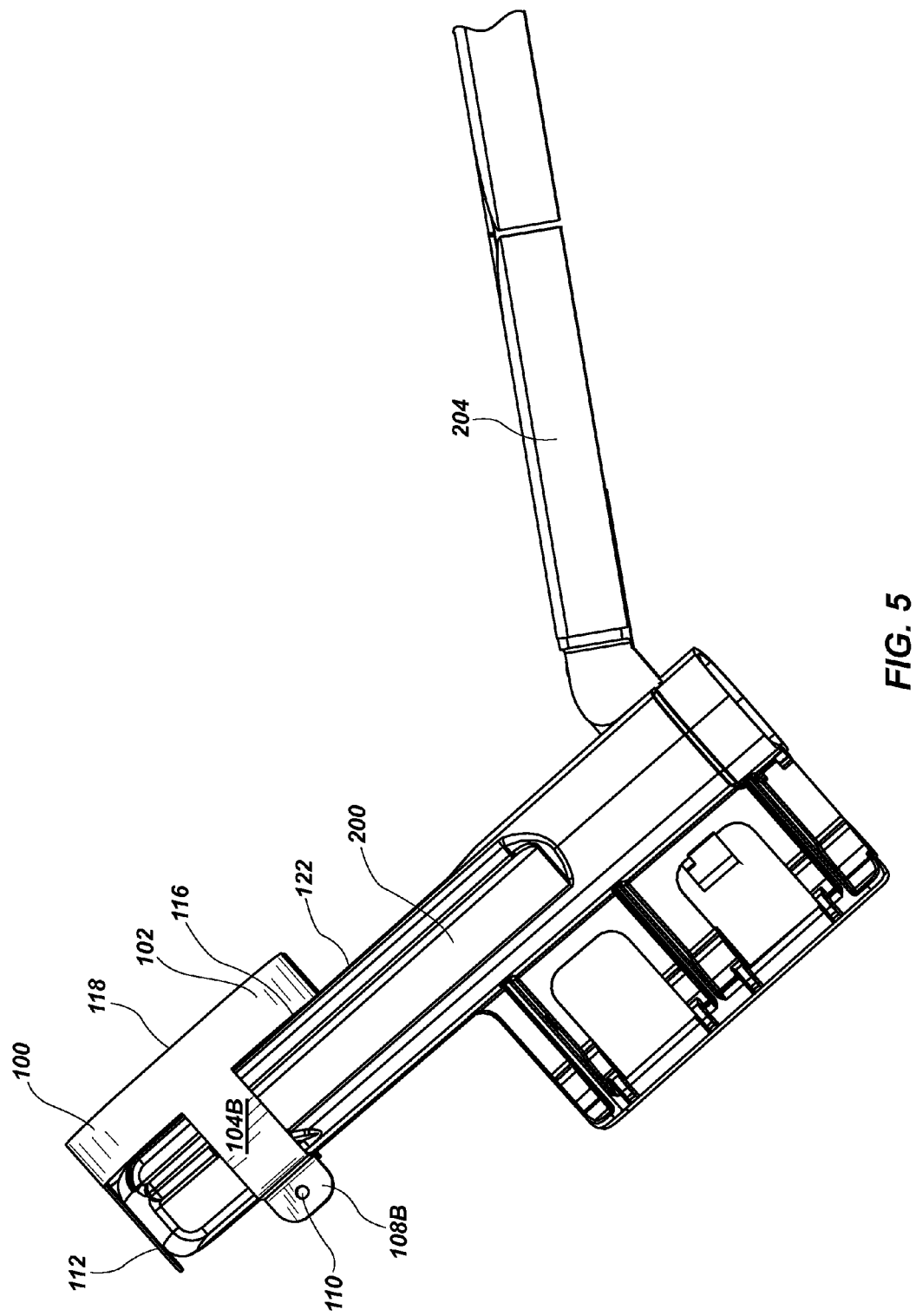
FIG. 5 is an enlarged left side view of the antenna focusing ring mounted to a typical subscriber module as shown in FIG. 2.

FIG. 5 is an enlarged left side view of the antenna focusing ring 100 mounted to a typical subscriber module 200 as shown in FIG. 2. FIG. 5 also illustrates the front rim 116 and rear rim 118 of the annular ring 102. FIG. 5 further illustrates the rear rim 118 resting adjacent to the transmitting surface 122 of the subscriber module 200.

Figure 6:
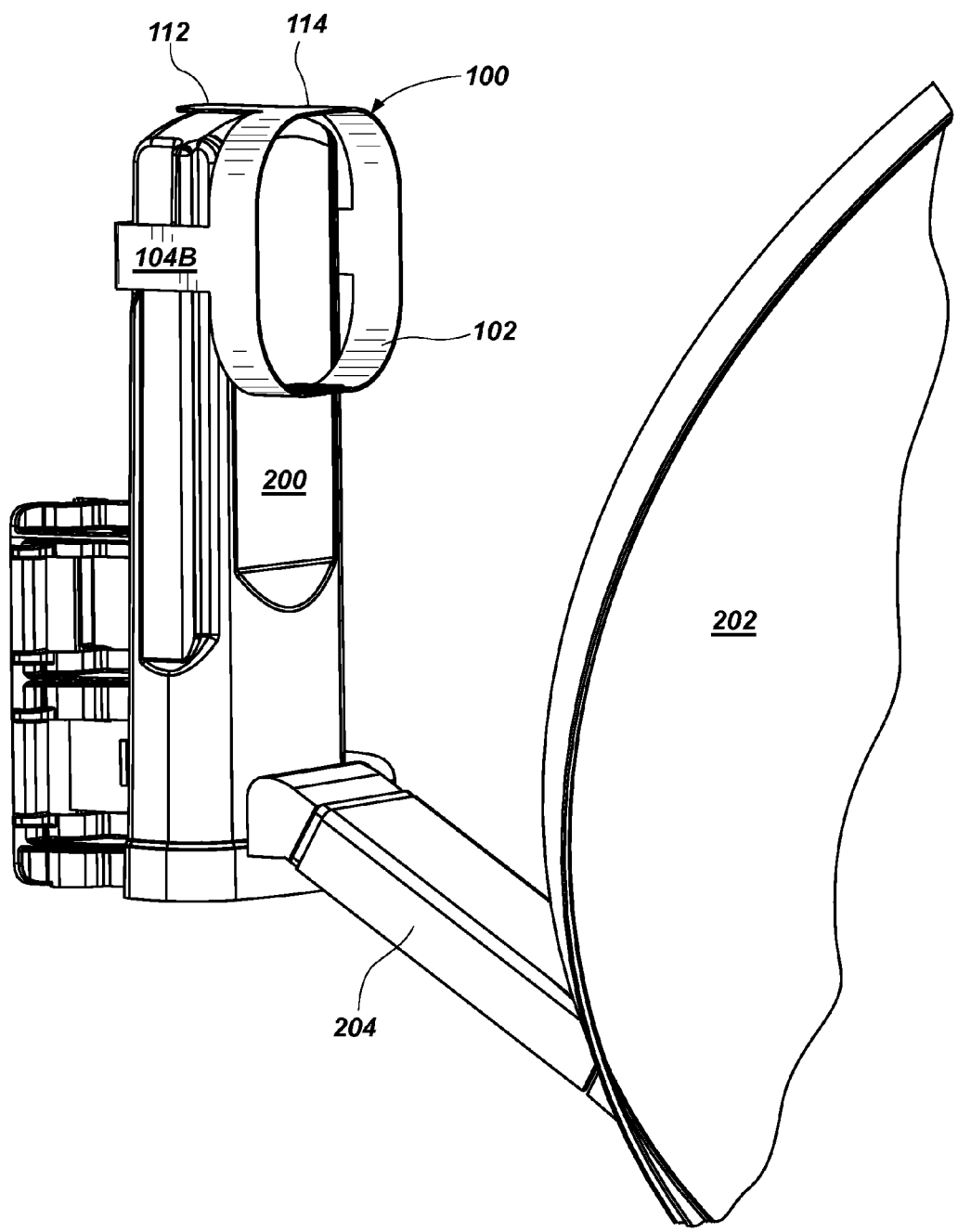
FIG. 6 is an enlarged left perspective view of the antenna focusing ring mounted to a typical subscriber module as shown in FIG. 3.

FIG. 6 is an enlarged left perspective view of the antenna focusing ring 100 mounted to a typical subscriber module 200 as shown in FIG. 3. The antenna focusing ring 102 focuses the emitted signal (not shown) onto the parabolic reflector antenna 202 to improve signal gain during operation.

Figure 7A:
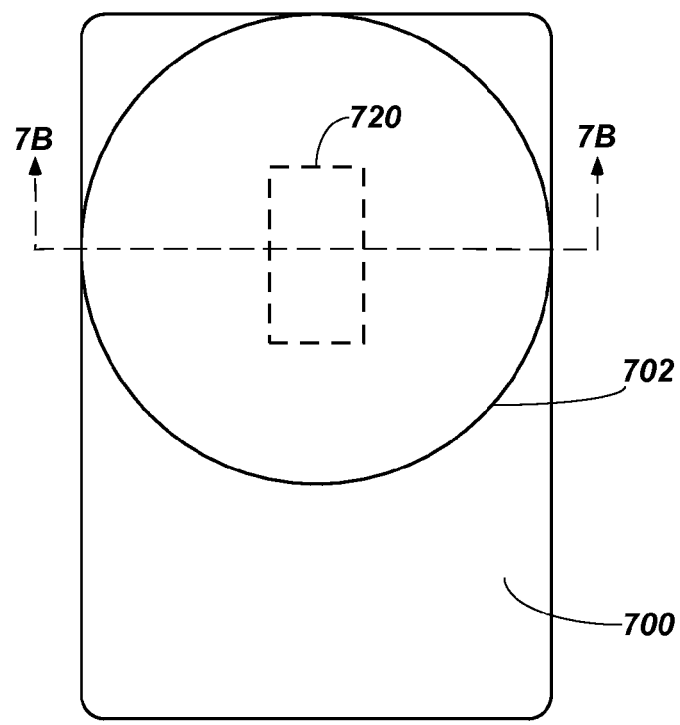
FIGS. 7A and 7B are front and cross-section views of an embodiment of an annular ring placed on a subscriber module according to the present invention.
Figure 7B:
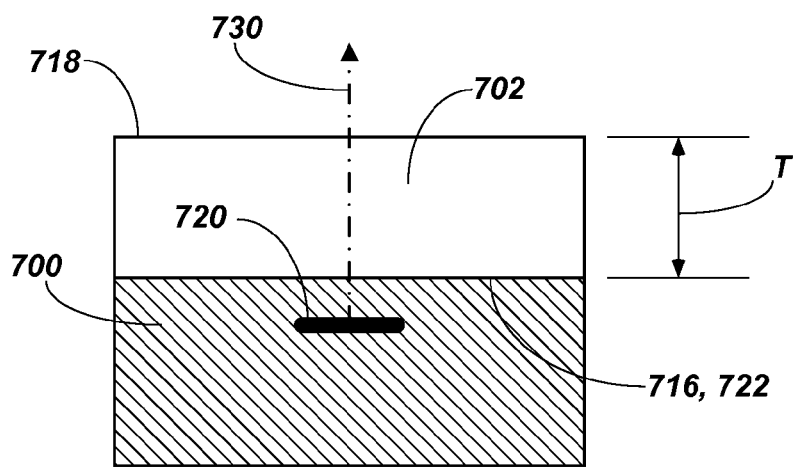

FIGS. 7A and 7B are front and cross-section views of an embodiment of an annular ring placed on a subscriber module according to the present invention. The subscriber module hanger is not shown in FIG. 7A or 7B for simplicity. As can be seen in FIG. 7A the internal patch antenna 720 inside the subscriber module 700 is preferably center within the annular ring 702. The shaded portion of subscriber module 700 shown in FIG. 7B represents the cross-sectional area that would be surrounded by a subscriber module hanger as described herein. FIG. 7B also illustrates a dot-dash arrow that represents the direction of signal radiation 730 from the internal patch antenna 720 that passes centrally through the annular ring 702.

Note that annular ring 702 is circular in shape (see FIG. 7A) and may have a thickness, T, as shown in FIG. 7B. According to various embodiment embodiments of annular rings 102 (FIGS. 1A-1D) and 702, thickness, T, may range from about 0.5 inches to about 1 inch. One particular embodiment includes an annular ring with thickness, T, approximately 0.7 inches. However, any suitable shape and thickness, T, of annular rings 102 (FIGS. 1A-1D) and 702 that will operate as a pseudo one ring scalar feed horn, may be used consistent with the teachings of the present invention. Note that the front rim 716 is adjacent to the transmitting surface 722 of the subscriber module 700. The distance between the front rim 716 and the rear rim 718 defines the thickness, T, of annular ring 702.

The following are descriptions of additional embodiments of antenna focusing rings. An antenna focusing ring is disclosed. The antenna focusing ring may include a metallic annular ring configured to surround an electromagnetic signal emitted by a subscriber module. The annular ring may be similar to the annular ring 102 shown in FIGS. 1A-1D. The antenna focusing ring may further include a subscriber module hanger attached to the ring, the hanger configured to encircle the subscriber module and position the ring around the emitted signal. The subscriber module hanger may comprise the arms 104A and 104B shown in FIGS. 1A-1D.

According to one embodiment, antenna focusing ring may further include a stop tang (see, e.g., 112, FIGS. 4-6) extending from the annular ring and configured to rest on top of the subscriber module thereby registering the ring at a position wherein the emitted signal is centered when radiating through the ring. According to another embodiment of the antenna focusing ring, the metallic annular ring may be a band of sheet metal formed into a closed circular loop.

According to yet another embodiment of the antenna focusing ring, the subscriber module hanger may include two opposed arms extending from diametrically opposed positions along the ring and wrapping around a surface area when viewed from below that is identical to the cross-section of the antenna to which it surrounds. The sizing of embodiments of the hanger is deliberately chosen to provide a friction fit when placed over the top of the particular subscriber module to which it is mounted by placing over the top of the post-like structure of the subscriber module and sliding down until the annular ring is centered around the path of signal radiation (see, e.g., 730, FIG. 7B) from an internal patch antenna (see, e.g., 720 FIGS. 7A and 7B) within the subscriber module (see, e.g., 700, FIG. 7B).

According to still another embodiment of the antenna focusing ring, the subscriber module hanger may further include mating parallel tangs disposed at ends of the two opposed arms adapted to be secured to each other via aligned holes in each of the tangs, the holes configured to receive a mounting bolt therethrough, the mounting bolt further configured for securing the ring to the subscriber module. See the arms 104A and 104B with respective tangs 108A and 108B shown in FIGS. 1A-1D, for just one example. Other means of securing the annular ring to a subscriber module may also be used consistent with the present invention. For example and not by way of limitation, bands and clamps like those used to secure hoses, brackets, adhesives, and the like are all suitable structural equivalents to the subscriber module hanger disclosed herein.

According to still other embodiments, the antenna focusing ring may be formed of a metal. For example and not by way of limitation, the metal may be: steel, stainless steel, copper, aluminum or aluminum alloy. Of course any suitable metal that can act as a pseudo one ring scalar feed horn may be used consistent with the teachings of the present invention.

The annular ring may have any number of suitable shapes consistent with the teachings of the present invention. According to one embodiment of the antenna focusing ring, the annular ring may be oval-shaped (not shown in the FIGS). According to another embodiment of the antenna focusing ring, the annular ring may be circular-shaped, see e.g., 702, FIG. 7A. According to yet another embodiment of the antenna focusing ring, the annular ring may have a piecewise linear and circular shape.

Another embodiment of an antenna focusing ring is disclosed. The embodiment of an antenna focusing ring may include a metallic annular ring having a front rim (see, e.g., 116, FIGS. 1B-1D) and a rear rim (see, e.g., 118, FIGS. 1B-1D). The embodiment of an antenna focusing ring may further include two opposed arms (see, e.g., 104A and 104B, FIGS. 1A-1D) extending from opposite sides of the front rim (see, e.g., 116, FIGS. 1B-1D). According to this embodiment, each of the two opposed arms may end with a tang (see, e.g., 108A and 108B, FIGS. 1B-1D). The tangs may be opposed and parallel to each other and configured to be selectively affixed together, for example using a nut and bolt (not shown). The two opposed arms may enclose an area (see, e.g., shaded area 700, FIG. 7B) when viewed from below that is essentially identical to a cross-section of a subscriber module. The embodiment of an antenna focusing ring may further include the annular ring being configured to envelop and focus an electromagnetic signal transmitted from an internal patch antenna within the subscriber module.

According to yet another embodiment of the antenna focusing ring, the annular ring may further include sheet metal formed into the annular ring and the two opposed arms. According to a particular embodiment the sheet metal may be aluminum treated with a chromate conversion coating. According to another particular embodiment the sheet metal may be anodized aluminum. According to yet another particular embodiment the sheet metal may be galvanized steel. According to still another particular embodiment the sheet metal may be galvanized steel coated with paint. According to still yet another particular embodiment the sheet metal may be galvanized steel that is powder coated. According quite another embodiment the sheet metal may be stainless steel.

Yet another embodiment of an antenna focusing ring is disclosed. This embodiment of an antenna focusing ring may include a metallic annular ring having a front rim (see, e.g., 116, FIGS. 1B-1D) and a rear rim (see, e.g., 118, FIGS. 1B-1D). This embodiment of an antenna focusing ring may further include two opposed arms (see, e.g., 104A and 104B, FIGS. 1A-1D) extending from opposite sides of the front rim. Each of the two opposed arms may end with a tang (see, e.g., 108A and 108B, FIGS. 1B-1D), according to this embodiment. The tangs may be opposed and parallel to each other, according to this embodiment. The opposed tangs may be selectively affixed together, for example and not by way of limitation using a nut and bolt (not shown). The two opposed arms may enclose a cross-sectional area identical to a cross-section of a subscriber module, according to this embodiment. The arms are configured to slide over the top of a subscriber module for a friction fit with the rear rim of the annular ring adjacent to a transmitting surface of the subscriber module. The arms and tangs may comprise a subscriber module hanger as disclosed herein. This embodiment of an antenna focusing ring may further include the annular ring being configured to envelop and focus an electromagnetic signal transmitted from an internal patch antenna within the subscriber module.

According to one embodiment, the antenna focusing ring may be formed of sheet metal. According to yet another embodiment of the antenna focusing ring, the electromagnetic signal transmitted from the internal patch antenna passes through a central axis of the annular ring (see, e.g., arrow 730 of FIG. 7B).

While the foregoing advantages of the present invention are manifested in the illustrated embodiments of the invention, a variety of changes can be made to the configuration, design and construction of the invention to achieve those advantages. Hence, reference herein to specific details of the structure and function of the present invention is by way of example only and not by way of limitation.

What is claimed is:

1. An antenna focusing ring, comprising:
   a metallic annular ring configured to surround an electromagnetic signal emitted by a subscriber module; and
   a subscriber module hanger attached to the ring, the hanger configured to encircle the subscriber module and position the ring around the emitted signal, the subscriber module hanger further comprising mating parallel tangs disposed at ends of the two opposed arms adapted to be secured to each other via aligned holes in each of the tangs, the holes configured to receive a mounting bolt therethrough, the mounting bolt further configured for securing the ring to the subscriber module.

2. The antenna focusing ring according to claim 1, further comprising a stop tang extending from the ring and configured to rest on top of the subscriber module thereby registering the ring at a position wherein the emitted signal is centered when radiating through the ring.

3. The antenna focusing ring according to claim 1, wherein the metallic annular ring further comprises a band of sheet metal formed into a closed circular loop.

4. The antenna focusing ring according to claim 1, the subscriber module hanger comprises two opposed arms extending from diametrically opposed positions along the ring and wrapping around a surface area when viewed from below that is identical to the cross-section of the antenna to which it surrounds.

5. The antenna focusing ring according to claim 1, formed of a metal selected from the group consisting of: steel, stainless steel, copper, aluminum and aluminum alloy.

6. The antenna focusing ring according to claim 1, wherein the annular ring is oval-shaped.

7. The antenna focusing ring according to claim 1, wherein the annular ring is circular-shaped.

8. An antenna focusing ring, comprising:
   a metallic annular ring having a front rim and a rear rim;
   two opposed arms extending from opposite sides of the front rim, each of the two opposed arms ending with a tang, the tangs opposed and parallel to each other, the opposed tangs configured to be selectively affixed together, the two opposed arms enclosing an area when viewed from below, the area identical to a cross-section of a subscriber module; and
   the annular ring configured to envelop and focus an electromagnetic signal transmitted from an internal patch antenna within the subscriber module.

9. The antenna focusing ring according to claim 8, wherein the annular ring further comprises sheet metal formed into the annular ring and the two opposed arms.

10. The antenna focusing ring according to claim 9, wherein the sheet metal further comprises aluminum treated with a chromate conversion coating.

11. The antenna focusing ring according to claim 9, wherein the sheet metal further comprises anodized aluminum.

12. The antenna focusing ring according to claim 9, wherein the sheet metal further comprises galvanized steel.

13. The antenna focusing ring according to claim 12, wherein the galvanized steel is coated with paint.

14. The antenna focusing ring according to claim 12, wherein the galvanized steel is powder coated.

15. The antenna focusing ring according to claim 9, wherein the sheet metal further comprises stainless steel.

16. An antenna focusing ring, comprising:
a metallic annular ring having a front rim and a rear rim;
two opposed arms extending from opposite sides of the front rim, each of the two opposed arms ending with a tang, the tangs opposed and parallel to each other, the opposed tangs configured to be selectively affixed together, the two opposed arms enclosing an area when viewed from below, the area identical to a cross-section of a subscriber module, thereby allowing the arms to slide over the top of a subscriber module for a friction fit with the rear rim of the annular ring adjacent to a transmitting surface of the subscriber module; and
the annular ring configured to envelop and focus an electromagnetic signal transmitted from an internal patch antenna within the subscriber module.

17. The antenna focusing ring according to claim 16, further comprising sheet metal.

18. The antenna focusing ring according to claim 16, wherein the electromagnetic signal transmitted from the internal patch antenna passes through a central axis of the annular ring.

\* \* \* \* \*